US011380723B2

(12) United States Patent
Ayel

(10) Patent No.: US 11,380,723 B2
(45) Date of Patent: Jul. 5, 2022

(54) PIXEL ARRAY WITH INVERTED VOLTAGE FOLLOWER

(71) Applicant: Commissariat à l'Énergie Atomique et aux Énergies Alternatives, Paris (FR)

(72) Inventor: François Ayel, Grenoble Cedex 9 (FR)

(73) Assignee: Commissariat à l'Énergie Atomique et aux Énergies Alternatives, Paris (FR)

(*) Notice: Subject to any disclaimer, the term of this patent is extended or adjusted under 35 U.S.C. 154(b) by 34 days.

(21) Appl. No.: 16/703,979

(22) Filed: Dec. 5, 2019

(65) Prior Publication Data

US 2020/0185441 A1     Jun. 11, 2020

(30) Foreign Application Priority Data

Dec. 5, 2018  (FR) ...................................... 1872389

(51) Int. Cl.
| | | |
|---|---|---|
| *H01L 27/146* | (2006.01) | |
| *H04N 5/3745* | (2011.01) | |
| *H04N 5/378* | (2011.01) | |
| *H04N 5/374* | (2011.01) | |

(52) U.S. Cl.
CPC .. *H01L 27/14616* (2013.01); *H01L 27/14643* (2013.01); *H04N 5/378* (2013.01); *H04N 5/37457* (2013.01)

(58) Field of Classification Search
CPC ........ H01L 27/14616; H01L 27/14643; H04N 5/37457; H04N 5/378; H04N 5/3745; H04N 5/3741; H04N 5/374; H04N 5/243; H04N 5/369; H04N 5/3698
See application file for complete search history.

(56) References Cited

U.S. PATENT DOCUMENTS

| | | | |
|---|---|---|---|
| 6,697,111 B1* | 2/2004 | Kozlowski | H04N 5/363 348/241 |
| 7,847,846 B1* | 12/2010 | Ignjatovic | H04N 5/378 348/301 |
| 9,888,197 B1 | 2/2018 | Hynecek et al. | |
| 2007/0023786 A1 | 2/2007 | Johnson et al. | |

(Continued)

FOREIGN PATENT DOCUMENTS

| | | |
|---|---|---|
| CN | 102572322 A | 7/2012 |
| FR | 2855326 A1 | 11/2004 |
| JP | 2013-332944 A | 11/2001 |

OTHER PUBLICATIONS

Preliminary Search Report for French Application No. 1872389, dated Oct. 9, 2019.

*Primary Examiner* — Albert H Cutler
(74) *Attorney, Agent, or Firm* — Wolf, Greenfield & Sacks, P.C.

(57) ABSTRACT

A pixel array including a first pixel having a first transistor having: its control node coupled to a first photodiode; a first of its main conducting nodes coupled to a voltage output rail; and a second of its main conducting nodes coupled to a further voltage rail; a variable impedance coupling the voltage output rail to a first supply rail of the pixel array; and a current source coupling the further voltage rail to a second supply rail of the pixel array, wherein the variable impedance is controlled based on the voltage level on the further voltage rail.

12 Claims, 3 Drawing Sheets

(56) References Cited

U.S. PATENT DOCUMENTS

2013/0063637 A1\* 3/2013 Ebihara ................ H04N 5/357
                                                    348/300
2016/0223884 A1\* 8/2016 Kususaki ............... H04N 5/361
2017/0207262 A1\* 7/2017 Lin ................... H01L 27/14643
2017/0302870 A1\* 10/2017 Ikuma ................ H04N 5/37457

\* cited by examiner

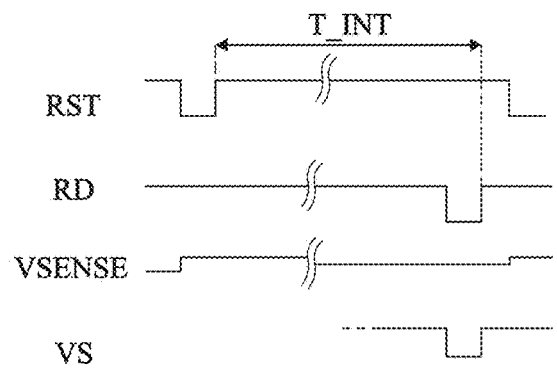
Fig 6
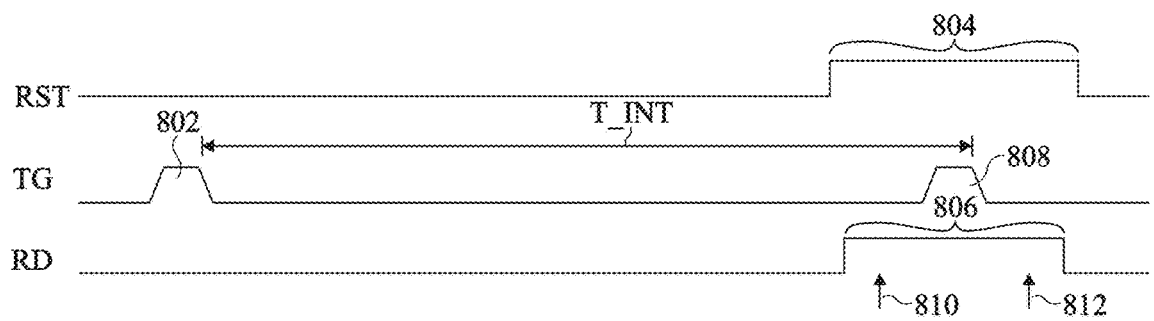
Fig 8
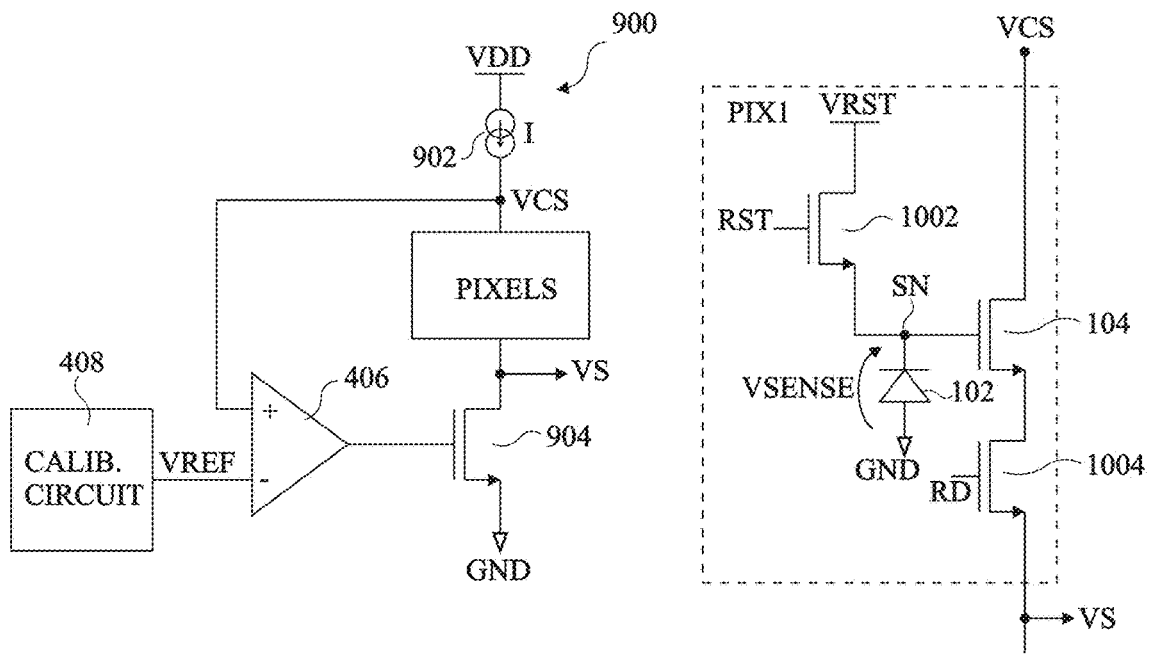
Fig 9
Fig 10

PIXEL ARRAY WITH INVERTED VOLTAGE FOLLOWER

The present patent application claims priority to French patent application 18/72389, filed on Dec. 5, 2018, the contents of which is hereby incorporated by reference in its entirety.

TECHNICAL FIELD

The present disclosure relates generally to the field of image sensors, and in particular to a pixel array and method of driving a pixel array.

BACKGROUND ART

In CMOS image sensors, a voltage level generated by a photodiode is generally read using a transistor arranged in a voltage follower configuration. This transistor for example has one of its main current conducting nodes coupled to a supply rail, and its other main conducting node coupled to an output line. A current source is for example used to draw a current on the output line, and this permits the voltage at the gate of the voltage follower transistor to be read.

In order to reduce energy consumption, there is a desire in the art to reduce the operating voltage of image sensors. However, there is a technical difficulty in reducing the level of the supply voltage of each pixel while ensuring correct operation of the voltage follower transistor of each pixel.

There is thus a need in the art for a pixel array in which the supply voltage can be reduced to a relatively low level.

SUMMARY OF INVENTION

There is a need in the art for a pixel array, and method of driving a pixel array, that at least partially addresses one or more needs in the prior art. According to one aspect, there is provided a pixel array comprising: a first pixel comprising a first transistor having: its control node coupled to a first photodiode; a first of its main conducting nodes coupled to a voltage output rail; and a second of its main conducting nodes coupled to a further voltage rail; a variable impedance coupling the voltage output rail to a first supply rail of the pixel array; and a current source coupling the further voltage rail to a second supply rail of the pixel array, the variable impedance being controlled based on the voltage level on the further voltage rail. For example, the current source is a constant current source.

According to one embodiment, the pixel array further comprises a differential amplifier having a first input coupled to the further voltage rail, a second input coupled to a reference voltage level, and an output coupled to a control input of the variable impedance.

According to one embodiment, the reference voltage level is generated by a calibration circuit, the reference voltage level being variable at least as a function of temperature.

According to one embodiment, the variable impedance comprises a further transistor coupled by its main current conducting nodes between the first supply rail and the voltage output rail.

According to one embodiment, the pixel array further comprises: a second pixel comprising a second transistor having: its control node coupled to a second photodiode; a first of its main conducting nodes coupled to the voltage output rail; and a second of its main conducting nodes coupled to the further voltage rail.

According to one embodiment, the first pixel further comprises a first further transistor coupling the control node of the first transistor to a reset voltage rail.

According to one embodiment, the first pixel further comprises a second further transistor coupling the first main current conducting node of the first transistor to the voltage output rail, the second further transistor being configured to be rendered conductive during a read operation of a pixel voltage of the first pixel.

According to one embodiment, the first pixel further comprises a transfer gate coupling the control node of the first transistor to the first photodiode, the transfer gate being configured to be rendered conductive during a read operation of a pixel voltage of the first pixel.

According to a further aspect, there is provided a method of driving a first pixel of a pixel array during a read operation of the first pixel, the method comprising: applying, to a control node of a first transistor of the first pixel, a voltage level generated by a first photodiode, a first of the main conducting nodes of the first transistor being coupled to a voltage output rail and a second of the main conducting nodes of the first transistor being coupled to a further voltage rail; and adjusting a variable impedance coupling the voltage output rail to a first supply rail of the pixel array, the variable impedance being adjusted based on the voltage on the further voltage rail, the further voltage rail being coupled to a second supply rail via a current source. For example, the current source is a constant current source.

According to one embodiment, the method further comprises, prior to applying the voltage level to the control node of the first transistor, resetting the voltage level at the control node of the first transistor by rendering conductive a first further transistor of the first pixel.

According to one embodiment, the method further comprises rendering conductive a second further transistor of the first pixel during the read operation, the second further transistor coupling the first main current conducting node of the first transistor to the voltage output rail.

According to one embodiment, applying the voltage level to the control node of the first transistor comprises activating a transfer gate coupling the control node of the first transistor to the photodiode.

BRIEF DESCRIPTION OF DRAWINGS

The foregoing features and advantages, as well as others, will be described in detail in the following description of specific embodiments given by way of illustration and not limitation with reference to the accompanying drawings, in which:

FIG. 6 is a timing diagram illustrating an example of signals in the pixel circuit of FIG. 5;

FIG. 8 is a timing diagram illustrating an example of signals in the pixel circuit of FIG. 7;

FIG. 9 schematically illustrates a pixel array according to a further example embodiment of the present disclosure; and FIG. 10 schematically illustrates a pixel circuit of the pixel array of FIG. 9 in more detail according to an example embodiment.

DESCRIPTION OF EMBODIMENTS

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. For example, decoding circuitry for driving rows and columns of pixels in a pixel array have not been described in detail, such circuits being well known to those skilled in the art.

Unless indicated otherwise, when reference is made to two elements connected together, this signifies a direct connection without any intermediate elements other than conductors, and when reference is made to two elements linked or coupled together, this signifies that these two elements can be connected or they can be linked or coupled via one or more other elements.

Figure 1:
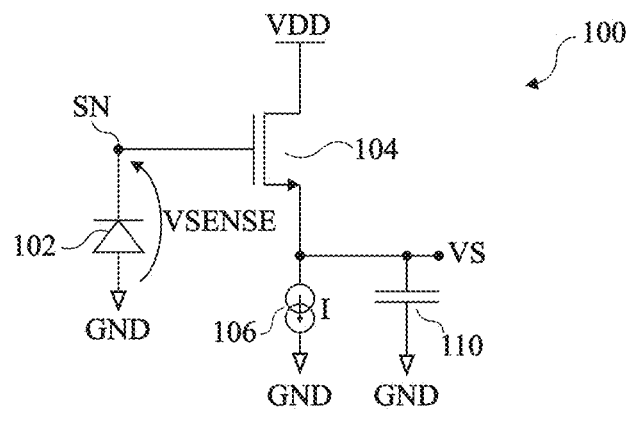
FIG. 1 schematically represents an example of the operation of a pixel circuit.

FIG. 1 schematically represents an example of the operation of a pixel circuit 100.

The pixel circuit 100 comprises a photodiode 102, which is for example a pinned photodiode having its anode coupled to a ground rail GND, and its cathode coupled to a sense node SN. The pixel circuit 100 also comprises a transistor 104 having its control node coupled to the sense node SN, and configured to operate as a voltage follower. The transistor 104 in the example of FIG. 1 is an n-channel MOS (NMOS) transistor, having its drain connected to a supply rail, which is for example at the supply voltage VDD of the pixel array, although it could be at another voltage. The source of the transistor 104 is connected to a voltage output rail VS, which is in turn coupled to the ground rail via a current source 106. A pixel voltage read from the pixel is for example stored to a sampling capacitor 110 represented in FIG. 1 connected directly to the output voltage rail VS, although in practice there is generally a switch (not illustrated) between the output voltage rail VS and the sampling capacitor 110.

The voltage follower transistor 104 provides an adaptation stage between the photodiode 102 and the voltage output rail VS, this transistor presenting, to the sense node SN, a relative high input impedance, and to the voltage output rail VS, a relatively low output impedance.

The voltage VS resulting from a read operation of the pixel voltage VSENSE generated by the photodiode 102 at the sense node SN is equal to A(VSENSE-VOFF), where A is the amplification between the sense node SN and the voltage output rail VS, and VOFF is the gate source voltage VGS of the transistor 104. The transistor 104 should conduct a current during this read operation, meaning that there will be difficulties in reading the voltage at low values of VSENSE, and in particular when the voltage VSENSE-VOFF on the voltage output rail VS is close to or falls below the minimum voltage permitting the current source 106 to function correctly. Indeed, this can lead to a current error in the current generated by the current source 106, and thus a voltage mismatch on the output voltage rail VS.

Figure 2:
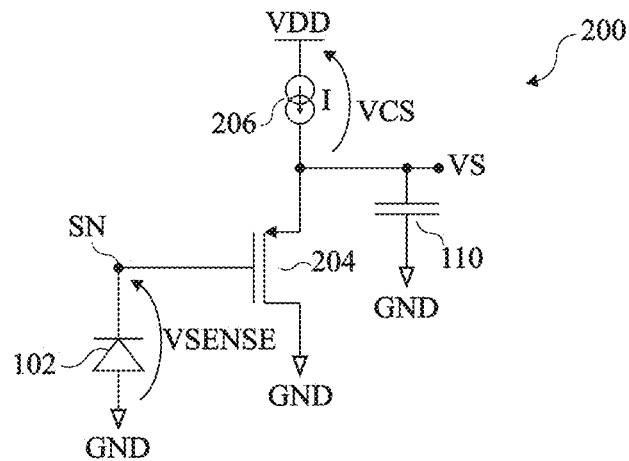
FIG. 2 schematically represents an example of the operation of another pixel circuit.

FIG. 2 schematically represents an example of the operation of another pixel circuit 200, which is similar to the circuit 100, except that it is modified for the case of a p-channel MOS (PMOS) transistor 204 implementing the voltage follower. The current source 106 is thus replaced by a current source 206 coupled between the source of the transistor 204 and a supply rail, which is for example at the supply voltage VDD, although it could be at another voltage.

In the example of FIG. 2, the maximum level of the voltage VSENSE that can be successfully read is limited by the fact that VS should not fall below VSENSE+VOFF, where VOFF is the gate source voltage of the transistor 204. Assuming that the current source 206 should drop a voltage of at least Vcs in order for it to be sufficiently accurate, this means that the highest level of VSENSE that can be read is for example equal to VDD-Vcs-VOFF.

Figure 3:
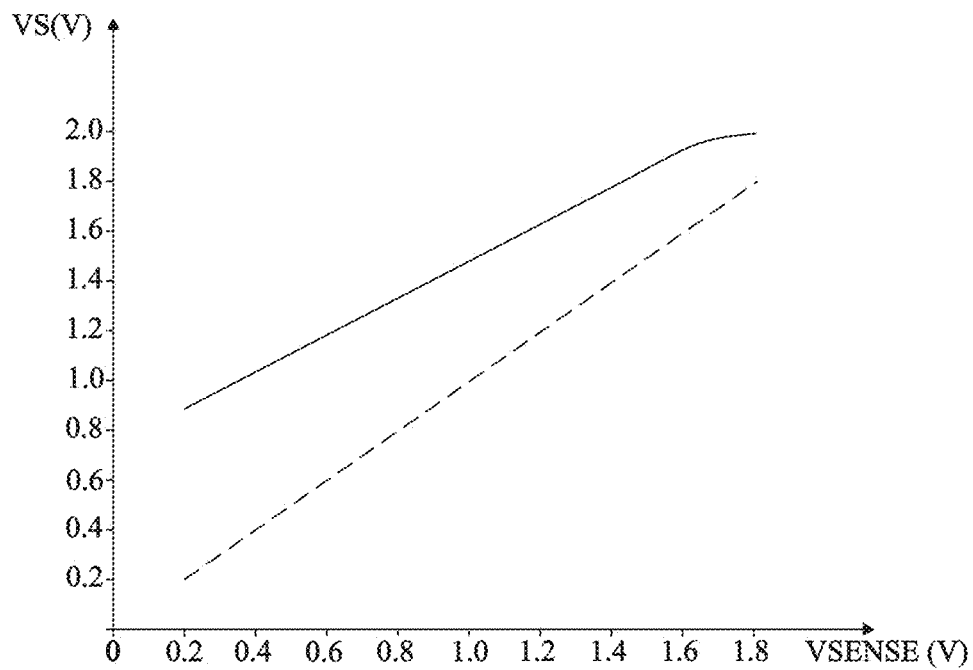
FIG. 3 is a graph representing voltages in the pixel circuit of FIG. 2 according to an example embodiment.

FIG. 3 is a graph representing, by a dashed line, an example of the voltage VSENSE, and by a solid line, an example of the voltage VS, in the pixel circuit 200 of FIG. 2. It can be seen that the gain falls away as the voltage VSENSE approaches the limit of the voltage VS, which is for example at around 2 V in the example of FIG. 3.

Thus, if it is desired to reduce the supply voltage level VDD of the pixel circuit of FIG. 1 or 2, this will have a direct impact on the range of pixel values VSENSE that can be successfully read.

Figure 4:
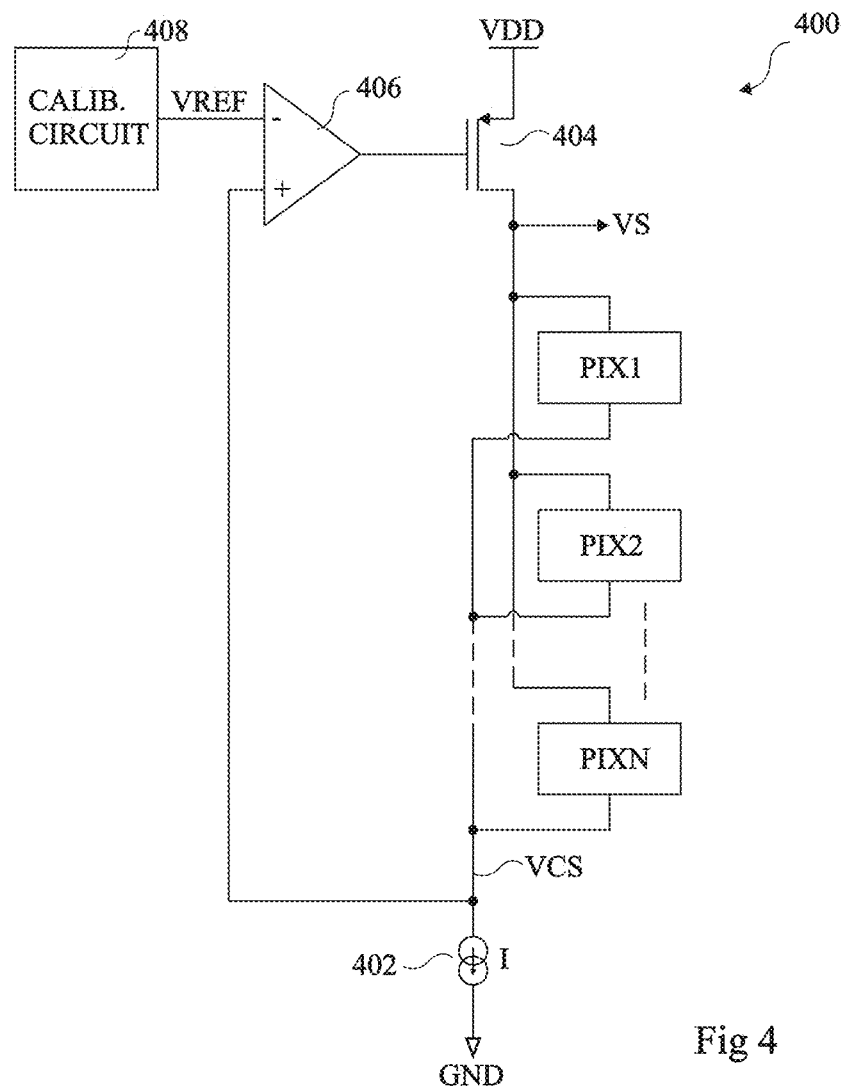
FIG. 4 schematically illustrates a pixel array according to an example embodiment of the present disclosure.

FIG. 4 schematically illustrates a column of a pixel array 400 according to an example embodiment of the present disclosure. While not illustrated in FIG. 4, the pixel array 400 may comprise a plurality of columns.

The column of the pixel array 400 of FIG. 4 for example comprises N pixel circuits PIX1 to PIXN, where N is for example equal to at least two. In alternative embodiments, each column could however comprise a single pixel circuit. Each pixel circuit is coupled between a voltage output rail VS and a further voltage rail VCS, which is for example coupled to the ground rail GND via a current source 402. The voltage output rail VS is coupled to a supply rail via a variable impedance 404 controlled by a differential amplifier 406. This supply rail is for example at the supply voltage VDD of the pixel array, although it could be at another voltage. The differential amplifier 406 for example controls the variable impedance 404 based on the voltage on the voltage rail VCS. In the example of FIG. 4, the differential amplifier 406 has one of its inputs, in this example its positive input, coupled to the voltage rail VCS, and its other input, in this example its negative input, coupled to a calibration circuit (CALIB. CIRCUIT) 408, which provides a reference voltage VREF. For example, the reference voltage VREF is a voltage that varies as a function of at least temperature in order to provide temperature compensation. In alternative embodiments, the reference voltage VREF could be fixed, or it could depend on other parameters such as process, the supply voltage or VS.

While not shown in FIG. 4, each pixel circuit for example comprises a voltage follower transistor similar to the circuit of FIG. 2. Advantageously, in FIG. 4, the voltage drop introduced by the current source 206 of FIG. 2 is no longer present between the pixels and the supply rail VDD. Instead, the current source 402 is positioned between the pixel circuits and the ground rail, and only the variable impedance 404 is placed between the pixel circuits and the supply rail VDD. Thus the voltage follower can be said to be inverted.

This variable impedance 404 is controlled by a feedback loop. In particular, if the voltage VSENSE of a pixel circuit being read increases, the voltage on the rail VS will also increase, reducing the voltage across the transistor 404, and thus causing the current through the voltage follower transistor of this pixel circuit to fall. The voltage on the rail VCS will thus decrease, and the impedance of the transistor 404 will be reduced by a reduction in the output voltage of the differential amplifier 406. In the opposite situation, if the voltage VSENSE of a pixel circuit being read decreases, the voltage on the rail VS will also decrease, increasing the voltage across the transistor 404, and thus causing the current through the voltage follower transistor of this pixel circuit to rise. The voltage on the rail VCS will thus rise, and the impedance of the transistor 404 will be increased by an increase in the output voltage of the differential amplifier 406. Thus the feedback loop operates to maintain the voltage drop (VCS) across the current source 402 relatively constant, independently of the voltage VSENSE of the pixel being read.

Figures 5, 7:
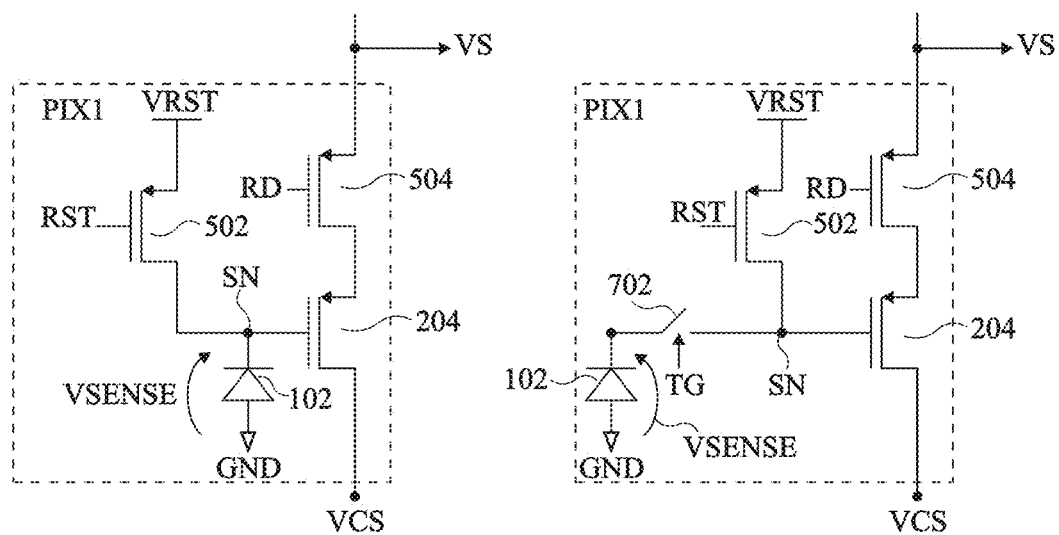
FIG. 5 schematically illustrates a pixel circuit of the pixel array of FIG. 4 in more detail according to an example embodiment.
FIG. 7 schematically illustrates a pixel circuit of the pixel array of FIG. 4 in more detail according to a further example embodiment.

FIG. 5 schematically illustrates the pixel circuit PIX1 of the pixel array of FIG. 4 in more detail according to an example embodiment. The other pixel circuits PIX2 to PIXN of FIG. 4 are for example implemented by similar circuits.

The pixel circuit PIX1 is for example similar to the pixel 200 described above in that it comprises a PMOS transistor 204 forming the voltage follower. In the example of FIG. 5, the pixel circuit further comprises a reset transistor 502, which is for example implemented by a PMOS transistor controlled by a signal RST and coupled by its source/drain nodes between the sense node SN and a reset voltage rail VRST. The pixel circuit also for example comprises a read transistor 504 controlled by a read signal RD and coupled by its source/drain nodes between the source of the transistor 204 and the voltage output rail VS.

FIG. 6 is a timing diagram illustrating a simple example of the timing of signals in the pixel circuit of FIG. 5, and in particular the timing of the signals RST, RD, VSENSE and VS.

Prior to the start of an integration period T_INT, the reset signal RST is for example brought low to couple the sense node SN to the reset voltage rail VRST, and thus the voltage VSENSE is initialized at the relatively high level VRST. When the reset signal goes high again, the integration period T_INT starts, and the voltage VSENSE starts to fall based on the light signal received by the pixel.

Close to the end of the integration period T_INT, the read signal RD for example goes low, causing the read transistor 502 to conduct, and thus bringing the voltage VS to a level determined by the level of VSENSE. The read signal RD for example goes high again to cause the level VSENSE to be sampled, and the reset signal RST also for example goes low shortly thereafter to reset again the voltage at the sense node SN. While not illustrated in FIG. 6, in some embodiments a reference level is read from the sense node during the reset operation prior to, or following, the integration period T_INT.

FIG. 7 schematically illustrates the pixel circuit PIX1 of the pixel array of FIG. 4 in more detail according to an alternative embodiment to that of FIG. 5. The pixel circuit of FIG. 7 is similar to that of FIG. 5, except that a transfer gate, represented by a switch 702, is positioned between the photodiode 102 and the sense node SN and controlled by a signal TG.

FIG. 8 is a timing diagram illustrating an example of the timing of signals in the pixel circuit of FIG. 7, and in particular the timing of the signals RST, TG and RD. In the example of FIG. 8, the voltage VSENSE and the voltage on the voltage output rail VS are not illustrated.

The signal RST is for example initially low, coupling the sense node SN to the reset level on the voltage rail VRST. The signal TG has a high pulse 802 causing the photodiode voltage to be reset, and starting an integration period T_INT at the falling edge of the pulse 802.

During a readout phase, the reset signal is for example brought high during a period 804 to isolate the sense node SN from the reset voltage rail VRST, and then, during the period 804, the read signal RD is brought high for a period 806, in order to transfer the voltage from the sense node SN to the voltage output rail VS. During the period 806, the signal TG comprises a pulse 808, transferring the photodiode voltage VSENSE to the sense node SN. As represented by arrows 810 and 812, the voltages on the voltage output rail VS are for example sampled by sampling capacitors (not illustrated in FIG. 7) before and after the pulse 808 of the signal TG in order to respectively capture the reference level and the photodiode level following integration.

FIG. 9 schematically illustrates a pixel array 900 according to a further example embodiment of the present disclosure. The example of FIG. 9 is similar to that of FIG. 4, except that the voltage follower transistor in each pixel (not illustrated in FIG. 9) is implemented by an NMOS rather than PMOS transistor. Thus the current source 402 of FIG. 4 is replaced by a current source 902 positioned between the voltage rail VCS and the supply rail VDD, and rather than the variable impedance 404, a variable impedance 904 is positioned between the voltage output rail VS and the ground rail GND and controlled by the differential amplifier 406. The variable impedance 904 is for example implemented by an NMOS transistor.

FIG. 10 schematically illustrates a pixel circuit of the pixel array of FIG. 9 in more detail according to an example embodiment, this pixel circuit being labelled PIX1 in FIG. 10. The other pixel circuits of FIG. 9 are for example implemented by similar circuits.

The pixel circuit PIX1 of FIG. 10 is for example similar to the pixel 100 described above in that it comprises an NMOS transistor 104 forming the voltage follower. In the example of FIG. 10, the pixel circuit further comprises a reset transistor 1002, which is for example implemented by an NMOS transistor controlled by a signal RST and coupled by its source/drain nodes between the sense node SN and a reset voltage rail VRST. The pixel circuit also for example comprises a read transistor 1004 controlled by a read signal RD and coupled by its source/drain nodes between the source of the transistor 104 and the voltage output rail VS.

Operation of the pixel circuit of FIG. 10 is for example similar to that of the pixel circuit of FIG. 5, except that the control signals RD and RST will be modified to account for the use of NMOS rather than PMOS transistors. In some embodiments, a transfer gate similar to the gate 702 of FIG. 7 could be added to the circuit of FIG. 10.

An advantage of the embodiments described herein is that a pixel array can use a relatively low supply voltage and/or the voltage range of the pixel voltages that can be read from each pixel can be increased. This is for example achieved by providing a variable impedance located at the column level, rather than at the pixel level.

Various embodiments and variants have been described. Those skilled in the art will understand that certain features of these embodiments can be combined and other variants will readily occur to those skilled in the art. For example, while three particular examples of pixel circuits have been described, it will be apparent to those skilled in the art that the principles described herein could be applied to any pixel circuit in which one or more pixel voltages are read out using a transistor operating as a voltage follower.

Furthermore, while in the examples described herein the variable impedances 404, 904 are implemented by transistors, in alternative embodiments they could be implemented by other devices, such as variable resistors.

Further still, it will be apparent to those skilled in the art that, while circuits have been described comprising positive supply rail VDD and a ground rail GND, more generally, the ground rail GND can be considered as a further supply rail that may be at the ground voltage, or at another voltage, including a negative voltage.

Furthermore, while examples have been described based on MOS transistor technology, it will be apparent to those skilled in the art that the techniques described herein could be applied to other transistor technologies.

What is claimed is:

1. A pixel array comprising:
   a first pixel comprising a first transistor having: its control node coupled to a first photodiode; a first of its main conducting nodes coupled to a voltage output rail; and a second of its main conducting nodes coupled to a further voltage rail;
   a variable impedance electrically coupling the voltage output rail to a first supply rail of the pixel array, wherein only the variable impedance is coupled between the voltage output rail and the first supply rail; and
   a current source coupling the further voltage rail to a second supply rail of the pixel array, wherein the variable impedance is controlled based on the voltage level on the further voltage rail.

2. The pixel array of claim 1, further comprising a differential amplifier having a first input coupled to the further voltage rail, a second input coupled to a reference voltage level, and an output coupled to a control input of the variable impedance.

3. The pixel array of claim 2, wherein the reference voltage level is generated by a calibration circuit, the reference voltage level being variable at least as a function of temperature.

4. The pixel array of claim 1, wherein the variable impedance (404, 904) comprises a further transistor coupled by its main current conducting nodes between the first supply rail and the voltage output rail.

5. The pixel array of claim 1, further comprising:
   a second pixel comprising a second transistor having: its control node coupled to a second photodiode; a first of its main conducting nodes coupled to the voltage output rail; and a second of its main conducting nodes coupled to the further voltage rail.

6. The pixel array of claim 1, wherein the first pixel further comprises a first further transistor coupling the control node of the first transistor to a reset voltage rail.

7. The pixel array of claim 1, wherein the first pixel further comprises a second further transistor coupling the first main conducting node of the first transistor to the voltage output rail, wherein the second further transistor is configured to be rendered conductive during a read operation of a pixel voltage of the first pixel.

8. The pixel array of claim 1, wherein the first pixel further comprises a transfer gate coupling the control node of the first transistor to the first photodiode, the transfer gate being configured to be rendered conductive during a read operation of a pixel voltage of the first pixel.

9. A method of driving a first pixel of a pixel array during a read operation of the first pixel, the method comprising:
   applying, to a control node of a first transistor of the first pixel, a voltage level generated by a first photodiode, a first of the main conducting nodes of the first transistor being coupled to a voltage output rail and a second of the main conducting nodes of the first transistor being coupled to a further voltage rail; and
   adjusting a variable impedance electrically coupling the voltage output rail to a first supply rail of the pixel array, the variable impedance being adjusted based on the voltage on the further voltage rail, the further voltage rail being coupled to a second supply rail via a current source;
   wherein only the variable impedance is coupled between the voltage output rail and the first supply rail.

10. The method of claim 9, further comprising, prior to applying the voltage level to the control node of the first transistor, resetting the voltage level at the control node of the first transistor by rendering conductive a first further transistor of the first pixel.

11. The method of claim 9, further comprising rendering conductive a second further transistor of the first pixel during the read operation, the second further transistor coupling the first main conducting node of the first transistor to the voltage output rail.

12. The method of claim 9, wherein applying the voltage level to the control node of the first transistor comprises activating a transfer gate coupling the control node of the first transistor to the photodiode.

* * * * *